United States Patent
Toba et al.

(10) Patent No.: US 8,476,693 B2
(45) Date of Patent: Jul. 2, 2013

(54) NONVOLATILE SEMICONDUCTOR MEMORY AND METHOD FOR MANUFACTURING THE SAME

(75) Inventors: Takayuki Toba, Kanagawa-ken (JP); Tohru Ozaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 118 days.

(21) Appl. No.: 13/050,297

(22) Filed: Mar. 17, 2011

(65) Prior Publication Data

US 2012/0139024 A1 Jun. 7, 2012

(30) Foreign Application Priority Data

Dec. 1, 2010 (JP) .................. P2010-268481

(51) Int. Cl.
*H01L 29/788* (2006.01)
(52) U.S. Cl.
USPC .......... 257/316; 257/324; 257/401; 257/618; 257/E21.646; 438/201; 438/593; 365/185.05
(58) Field of Classification Search
USPC .............. 257/296, 314, 315, 316, 324, 401, 257/411, 532, 618, E21.646, E21.68, E21.613, 257/E21.649, E21.687; 438/201, 211, 257, 438/593; 365/51, 185.05
See application file for complete search history.

(56) References Cited

U.S. PATENT DOCUMENTS

| | | | |
|---|---|---|---|
| 2002/0130355 A1* | 9/2002 | Takeuchi et al. | 257/315 |
| 2005/0218460 A1* | 10/2005 | Hasegawa et al. | 257/390 |
| 2005/0243602 A1* | 11/2005 | Umezawa | 365/185.11 |
| 2006/0018181 A1 | 1/2006 | Matsunaga et al. | |
| 2007/0002622 A1* | 1/2007 | Matsunaga et al. | 365/185.11 |
| 2008/0019190 A1* | 1/2008 | Watanabe et al. | 365/185.23 |
| 2009/0296477 A1* | 12/2009 | Kim et al. | 365/185.17 |
| 2010/0177546 A1 | 7/2010 | Sakuma et al. | |

* cited by examiner

*Primary Examiner* — William D Coleman
*Assistant Examiner* — Su Kim
(74) *Attorney, Agent, or Firm* — Oblon, Spivak, McClelland, Maier & Neustadt, L.L.P.

(57) ABSTRACT

In one embodiment, a nonvolatile semiconductor memory includes a memory cell array, a first silicon nitride film and a second silicon nitride film. The memory cell array includes NAND cell units. Each of the NAND cell units has memory cell transistors, a source-side select gate transistor and a drain-side select gate transistor. The source-side select gate transistors is disposed in such a manner as to face each other and the drain-side select gate transistors is disposed in such a manner as to face each other. The first silicon nitride film is present in a region between the source-side select gate transistors and is disposed at a position lowest from the upper surface of the semiconductor substrate. The second silicon nitride film is formed in a region between the drain-side select gate transistors and is disposed at a position lowest from the upper surface of the semiconductor substrate.

18 Claims, 8 Drawing Sheets

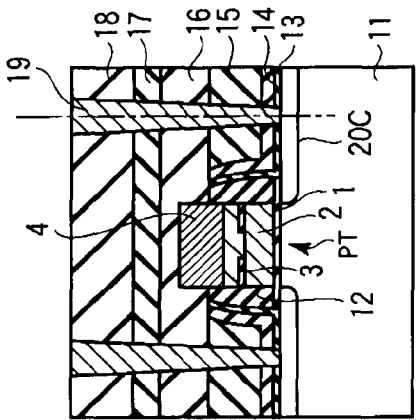
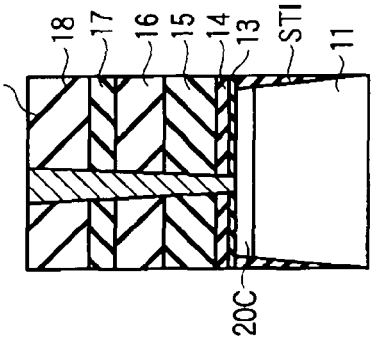
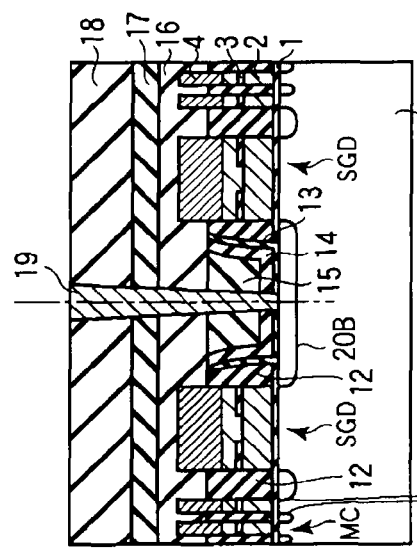
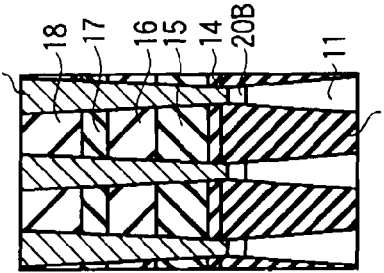
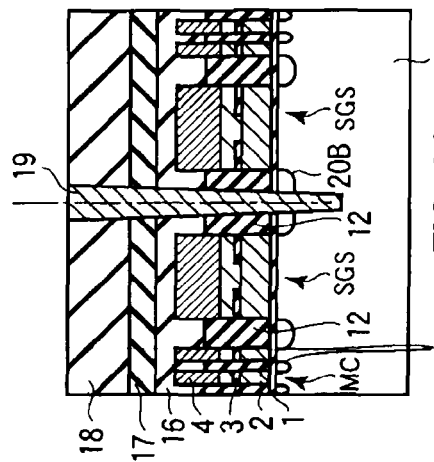
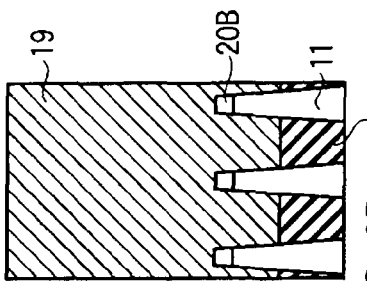

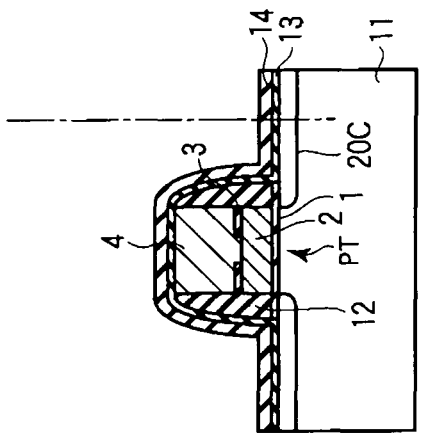
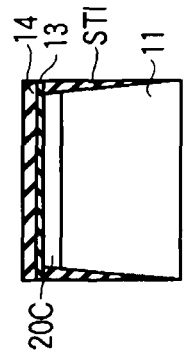
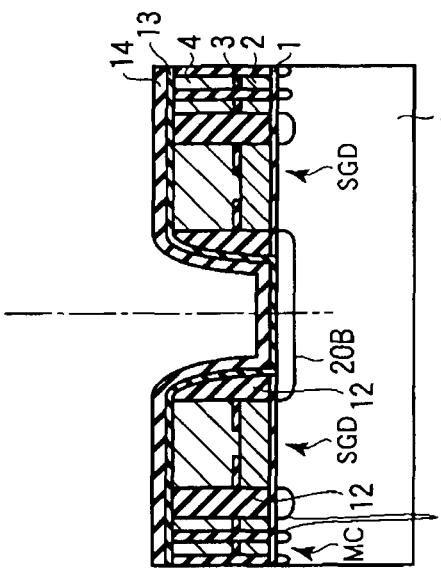
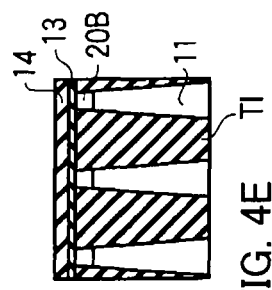
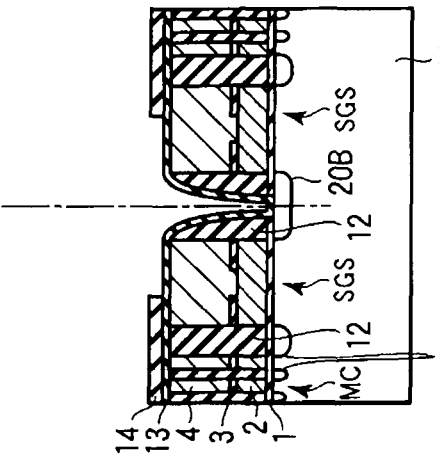
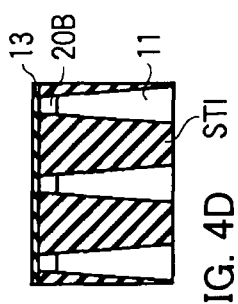

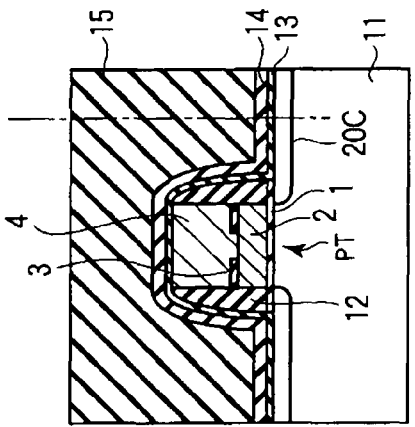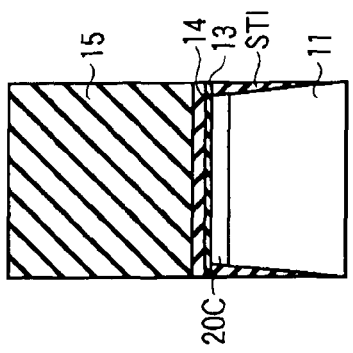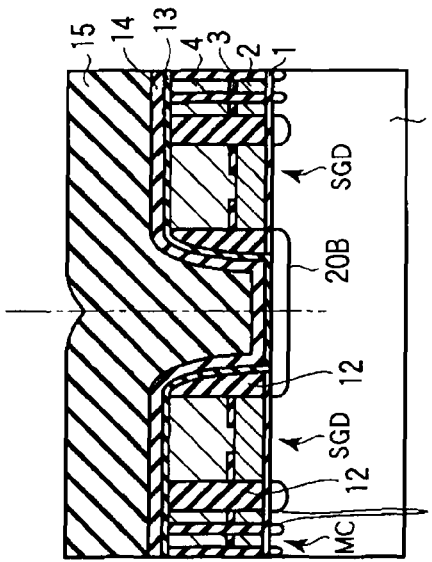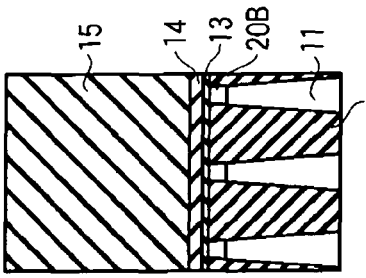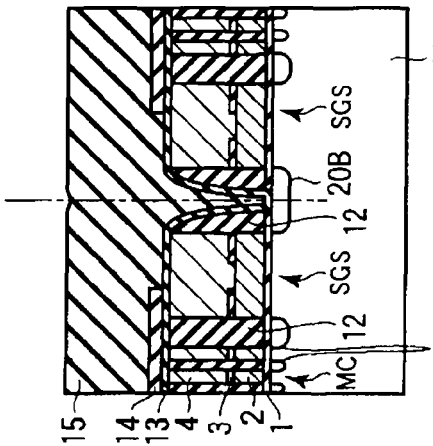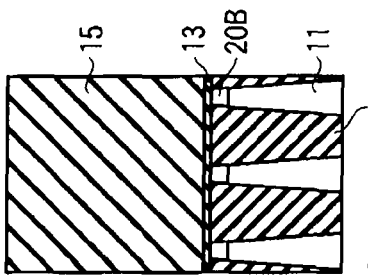

NONVOLATILE SEMICONDUCTOR MEMORY AND METHOD FOR MANUFACTURING THE SAME

CROSS REFERENCE TO RELATED APPLICATION

This application is based upon and claims the benefit of priority from the prior Japanese Patent Application No. 2010-268481, filed on Dec. 1, 2010, the entire contents of which are incorporated herein by reference.

FIELD

Embodiments described herein relate generally to a nonvolatile semiconductor memory and a manufacturing the nonvolatile semiconductor memory device.

BACKGROUND

In recent years, a NAND type flash memory, which is an inexpensive large-capacity nonvolatile semiconductor memory, has been expanding its use and market as a storage memory such as a memory card or a solid state disk (SSD). The storage memory is required to be larger in capacity and lower in cost further and, for the purpose of the large capacity and the low cost, miniaturization of a processing size has been advanced.

When a NAND string length and a select gate transistor interval are made smaller to reduce the chip area and costs of the NAND type flash memory, an interval between the select gate transistors may be filled with gate sidewall films of the select gate transistors. In this case, a silicon nitride film is formed as a stopper film between the select gate transistors during a time when forming a contact to a semiconductor substrate, and the silicon nitride film may be increased in thickness or formed at a level higher than a due position on the semiconductor substrate. As a result, a failure may occur in that a contact hole may not be opened.

BRIEF DESCRIPTION OF THE DRAWINGS

FIGS. 2A to 2F are cross-sectional views showing a structure of the NAND type flash memory according to the embodiment.

FIGS. 4A to 4F are cross-sectional views showing manufacturing steps of the NAND type flash memory according to the embodiment.

FIGS. 5A to 5F are cross-sectional views showing manufacturing steps of the NAND type flash memory according to the embodiment.

DETAILED DESCRIPTION

Figure 1:
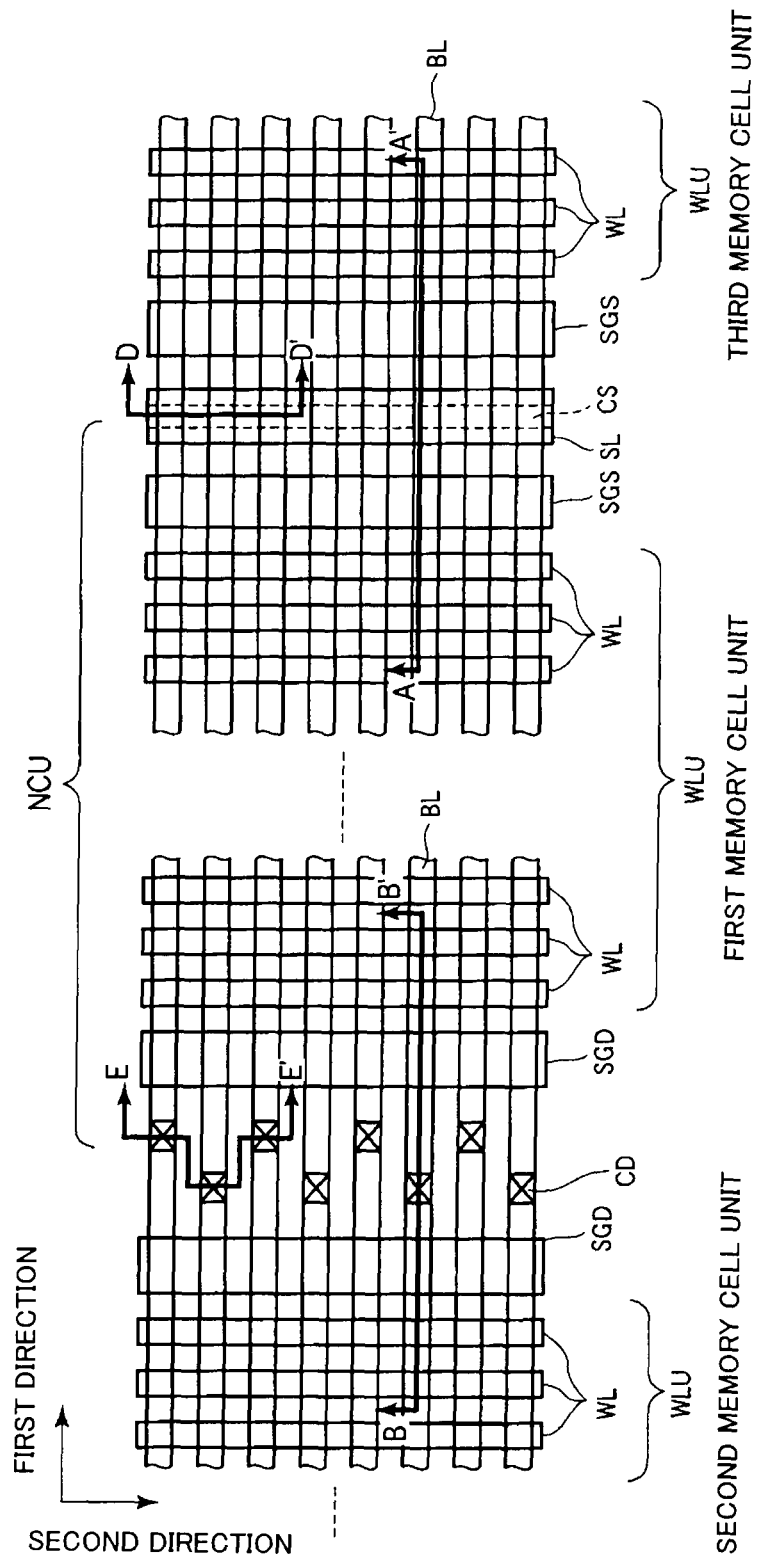
FIG. 1 is a plan view showing a portion of a memory cell array in a NAND type flash memory according to an embodiment.

In one embodiment, a nonvolatile semiconductor memory includes a memory cell array, a first silicon nitride film and a second silicon nitride film. the memory cell array includes a plurality of NAND cell units, Each of NAND cell units has a plurality of memory cell transistors formed on a semiconductor substrate at a predetermined spacing. Each of memory cell transistors has a first gate insulating film, a floating gate electrode, a second gate insulating film and a control gate electrode stacked on the semiconductor substrate in the order. Each of NAND cell units has a source-side select gate transistor disposed at one end of the plurality of memory cell transistors and a drain-side select gate transistor disposed at the other end of the plurality of memory cell transistors. The source-side select gate transistors of the NAND cell unit is disposed in such a manner as to face each other and the drain-side select gate transistors of the NAND cell unit is disposed in such a manner as to face each other. The first silicon nitride film is present in a region between the source-side select gate transistors and is disposed at a position lowest from the upper surface of the semiconductor substrate. The second silicon nitride film is formed in a region between the drain-side select gate transistors and is disposed at a position lowest from the upper surface of the semiconductor substrate. A spacing between the source-side select gate transistors is smaller than a spacing between the drain-side select gate transistors. A distance from the upper surface of the semiconductor substrate to the upper surface of the first silicon nitride film is larger than a distance from the upper surface of the semiconductor substrate to the upper surface of the second silicon nitride film.

Hereinafter, further embodiments will be described with reference to the drawings. In the drawings, same reference characters denote the same or similar portions.

Embodiment

A description will be given of a NAND type flash memory as the nonvolatile semiconductor memory. The following will describe a configuration of the NAND type flash memory of the embodiment.

The NAND type flash memory includes a memory cell array region in which memory cell transistors (hereinafter referred to as memory cells) are formed and a peripheral circuit region in which peripheral circuits are formed which are configured to perform write, read and erasure operations are performed to the memory cells.

The memory cell array region has multiple NAND cell units. The NAND cell unit has the multiple memory cells connected in series and a source-side select gate transistor (hereinafter referred to as a source select transistor) and a drain-side select gate transistor (hereinafter referred to as a drain select transistor) that are connected to the respective ends of those memory cells in such a manner as to sandwich them. The peripheral circuit region has the peripheral circuits including transistors (hereinafter referred to as peripheral transistors) configured to perform write, read and erasure operations to the memory cells, respectively.

FIG. 1 is a plan view showing a portion of a memory cell array in the NAND type flash memory of the embodiment.

As shown in FIG. 1, multiple stripe-shaped bit lines BL extending in a first direction is arranged along a second direction. Further, multiple stripe-shaped word lines WL extending in the second direction is arranged in such a manner as to run over the multiple bit lines BL, so that a predetermined number of the word lines constitute one word line unit WLU.

Stripe-shaped select gate lines SGS, SGD extending in the second direction are formed in such a manner as to sandwich the word line units WLU. The word line units WLU and the select gate lines SGS, SGD constitute a NAND cell unit NCU. A memory cell transistor (not shown) is formed below an intersection of the word line WL and the bit line BL, while a source select transistor and a drain select transistor (not shown) are formed below the intersection of the select gate line SGS and the bit line BL and that of the select gate line SGD and the bit line BL, respectively.

A common source line SL extends in the second direction between the select gate lines SGS. A contact plug CS constituted of one line extending in the second direction and connected to a diffusion layer of the source select transistor is formed below the common source line SL. The contact plug CS may be constituted of multiple circular contact plugs.

A contact plug CD connected to the bit line BL is formed between the select gate lines SGD. The contact plugs CD are connected to the diffusion layers of the drain select transistors and arranged along the second direction in such a manner that the neighboring contact plugs CD are shifted in the first direction. That is, the contact plugs are arranged in a zigzag manner along the second direction.

FIGS. 2A to 2F are cross-sectional views showing a structure of the NAND type flash memory of the embodiment. FIG. 2A is a cross-sectional view taken along line A-A' of FIG. 1, showing cross-sectional profiles of the memory cell and the source select transistor SGS. FIG. 2B is a cross-sectional view taken along line B-B' of FIG. 1, showing the cross-sectional profiles of the memory cell and the drain select transistor SGD. FIG. 2C shows a cross-sectional profile of a peripheral transistor taken along the first direction. It is here assumed that the first direction of the peripheral transistor is the same as the first direction of the memory cell array. However, of course, it does not matter even if there is another peripheral transistor of which direction is 90 degrees different from that of the peripheral transistor shown in FIG. 2C. FIG. 2D is a cross-sectional view taken along line D-D' of FIG. 1 and FIG. 2E is a cross-sectional view taken along line E-E' of FIG. 1. FIG. 2F shows a cross-sectional profile (cross-sectional profile in the second direction perpendicular to the first direction) taken along a broken line of FIG. 2C.

The cross-sectional profiles of a memory cell MC and the source select transistor SGS are as follows.

As shown in FIG. 2A, a gate insulating film (tunnel oxide film) 1 is formed on a semiconductor substrate 11. Pluralities of memory cell MC stack gates (word lines) and source select transistor SGS stack gates (select gate lines) that compose a first NAND cell unit are formed on the gate insulating film 1. The multiple memory cell MC stack gates are arranged with predetermined spacing between them. The source select transistor SGS stack gate is disposed adjacent to the end of one of the memory cell MC stack gates.

Further, a second NAND cell unit is disposed adjacent to the first NAND cell unit on the semiconductor substrate 11. The source select transistor SGS stack gates of the second NAND cell unit are disposed adjacent to the source select transistor SGS stack gates of the first NAND cell unit.

The memory cell MC stack gate has a floating gate electrode 2, an inter-gate insulating film 3 and a control gate electrode 4 formed on the gate insulating film 1 on the semiconductor substrate 11 in the order. The control gate electrode 4 has a silicide layer on the top.

The source select transistor SGS stack gate has the first gate electrode 2, the inter-gate insulating film 3 and the control gate electrode 4 formed on the gate insulating film 1 which is formed on the semiconductor substrate 11 in the order. The control gate electrode 4 has the silicide layer on the top. The inter-gate insulating film 3 of the source select transistor SGS stack gate has an opening. The first gate electrode 2 and the control gate electrode are electrically connected to each other.

The semiconductor substrate 11 is divided in the second direction by an element separation insulating film STI extending in the first direction.

A diffusion layer 20A is formed in the semiconductor substrate 11 between the memory cell MC stack gates and the semiconductor substrate 11 between the memory cell MC stack gate and the source select transistor SGS stack gate. A diffusion layer 20B is formed in the semiconductor substrate 11 between the source select transistor SGS stack gates.

An inter-layer insulating film (sidewall insulating film) 12 is formed between the memory cell MC stack gates and between the memory cell MC stack gate and the source select transistor SGS stack gate. The inter-layer insulating film 12 comes in a silicon oxide film, for example. The sidewall insulating film 12 is formed on a side surface of the source select transistor SGS stack gate.

An inter-layer insulating film 16 (second inter-layer insulating film) is formed on the memory cells MC and the source select transistors SGS. A silicon nitride film 17 (first silicon nitride film) is formed on the inter-layer insulating film 16 (including a region between the source select transistor SGS stack gates), and another inter-layer insulating film 18 is formed on the silicon nitride film 17.

A contact plug 19 (source contact, first contact of Claim 1) configured to connect the diffusion layer 20B and the source line SL to each other is formed between the source select transistor SGS stack gates. The contact plug 19 is connected through the silicon nitride film 17, the inter-layer insulating film 16 and the inter-layer insulating film 12 to the diffusion layer 20B. Further, a position of a bottom surface of the contact plug 19 is lower than that of the bottom surface of the diffusion layer 20B. Further, the position of the bottom surface of the contact plug 19 is higher than that of the bottom surface of the element separation insulating film STI. Further, no silicon nitride film is present between the source select transistor SGS stack gates. That is, the inter-layer insulating films 16, 12 formed between the silicon nitride film 17 and the semiconductor substrate 11 are made of a material more difficult to trap electrons than the silicon nitride film 17 between the source select transistor SGS stack gates. Therefore, no electrons are trapped by the silicon nitride film between the source select transistor SGS stack gates. As a result, it is possible to prevent fluctuations in threshold value of the source select transistors SGS.

The cross-sectional profiles of the memory cell MC and the drain select transistor SGD are as follows.

As shown in FIG. 2B, the gate insulating film 1 is formed on the semiconductor substrate 11. The pluralities of memory cell MC stack gates (word lines) and drain select transistor SGD stack gates (select gate lines) that compose the first NAND cell unit are formed on the gate insulating film 1. The drain select transistor SGD stack gate is disposed adjacent to the end of one of the memory cell MC stack gates.

Further, a third NAND cell unit is disposed adjacent to the first NAND cell unit on the semiconductor substrate 11. The drain select transistor SGD stack gates of the third NAND cell unit are disposed adjacent to the drain select transistor SGD stack gates of the first NAND cell unit.

The memory cell MC stack gate has the floating gate electrode 2, the inter-gate insulating film 3 and the control gate electrode 4 formed on the gate insulating film 1 which is formed on the semiconductor substrate 11 in the order. The control gate electrode 4 has the silicide layer on the top.

The drain select transistor SGD stack gate has the first gate electrode 2, the inter-gate insulating film 3 and the control gate electrode 4 formed on the gate insulating film 1 which is formed on the semiconductor substrate 11 in the order. The control gate electrode 4 has the silicide layer on the top. The inter-gate insulating film 3 of the drain select transistor SGD stack gate has an opening. The first gate electrode 2 and the control gate electrode 4 are electrically connected to each other.

The diffusion layer 20A is formed on the semiconductor substrate 11 between the memory cell MC stack gates and the semiconductor substrate 11 between the memory cell MC stack gate and the drain select transistor SGD stack gate. The diffusion layer 20B is formed on the semiconductor substrate 11 between the drain select transistor SGD stack gates.

The inter-layer insulating film 12 is formed between the memory cell MC stack gates and between the memory cell MC stack gate and the drain select transistor SGD stack gate. The sidewall insulating film 12 is formed on the side surface of the drain select transistor SGD stack gate.

The inter-layer insulating film 16 is formed in the memory cells MC and the drain select transistors SGD. The silicon nitride film 17 is formed on the inter-layer insulating film 16 (including a region between the drain select transistor SGD stack gates), and further the inter-layer insulating film 18 is formed on the silicon nitride film 17.

A spacer film 13 and a stopper film 14 are formed on the semiconductor substrate 11 between the drain select transistor SGD stack gates. The stopper film 14 can be used also as a stopper at the time of forming contact holes. The spacer film 13 comes in a silicon oxide film, for example, and the stopper film 14 comes in a silicon nitride film (second silicon nitride film), for example. The stopper film 14 is U-shaped between the drain select transistors SGD. An inter-layer insulating film 15 (first inter-layer insulating film) is formed in such a manner as to fill the U-shaped dent portion of the stopper film 14. The inter-layer insulating film 15 comes in a silicon oxide film, a BPSG (Boron-doped Phospho-Silicate Glass) film, a BSG (Boron-Silicate Glass) film, a PSG (Phospho-Silicate Glass) film or a NSG (Non-doped Silicate Glass film, for example. The contact plug 19 (drain contact, second contact of Claim 1) connecting the diffusion layer 20B and the bit line BL to each other is formed between the drain select transistor SGD stack gates. The contact plug 19 is connected to the diffusion layer 20B through the inter-layer insulating film 18, the silicon nitride film 17, the inter-layer insulating film 16, the inter-layer insulating film 15, the stopper film 14 and the spacer film 13. Further, the position of the bottom surface of the contact plug 19 is higher than that of the bottom surface of the diffusion layer 20B.

A cross-sectional profile of a peripheral transistor PT is as follows.

As shown in FIG. 2C, the gate insulating film 1 is formed on the semiconductor substrate 11. Peripheral transistor PT stack gates are formed on the gate insulating film 1. The peripheral transistor PT stack gate has the first gate electrode 2, the inter-gate insulating film 3 and the control gate electrode 4 formed on the gate insulating film 1 which is formed on the semiconductor substrate 11 in the order. The control gate electrode 4 has the silicide layer on the top. The inter-gate insulating film 3 of the stack gate has an opening. The first gate electrode 2 and the control gate electrode 4 are electrically connected to each other.

A diffusion layer 20C is formed in the semiconductor substrate 11 of both sides of the peripheral transistor PT stack gate in such a manner as to sandwich the peripheral transistor PT stack gate.

The sidewall insulating film 12 is formed on the side surface of the peripheral transistor PT stack gate, and the spacer film 13 and the stopper film 14 are formed on the sidewall insulating film 12 in the order. Moreover, the inter-layer insulating film 15 is formed on the stopper film 14.

The inter-layer insulating film 16 is formed on the peripheral transistors. The silicon nitride film 17 is formed on the inter-layer insulating film 16, and further the inter-layer insulating film 18 is formed on the silicon nitride film 17. Moreover, the contact plug 19 connected to the diffusion layer 20C is formed on the diffusion layer 20C of the peripheral transistor PT. The contact plug 19 is connected to the diffusion layer 20C through the inter-layer insulating film 18, the silicon nitride film 17, the inter-layer insulating film 16, the inter-layer insulating film 15, the stopper film 14 and the spacer film 13.

In the embodiment, spacing between the source select transistor SGS stack gates can be made smaller than that between the drain select transistor SGD stack gates. Accordingly, the memory cell array can be miniaturized. This is because the stopper film 14 is not formed between the source select transistor SGS stack gates. If the spacing between the source select transistor SGS stack gates is too small, an upper surface of the stopper film 14 between the source select transistor SGS stack gates is formed at a level higher than that of the stopper film 14 between the drain select transistor SGD stack gates as described below. That is, the stopper film 14 between the source select transistor SGS stack gates has a larger film thickness than the stopper film 14 between the drain select transistor SGD stack gates. If the contact hole is formed in the condition between the source select transistor SGS stack gates and between the drain select transistor SGD stack gates simultaneously, possibilities are high that the bottom surface of the contact hole between the source select transistors SGS may not reach the semiconductor substrate 11 (diffusion layer 20B).

If over-etching is performed in order to dig down the bottom surface of the contact hole between the source select transistors SGS, the bottom surface of the contact hole between the drain select transistors SGD is also dug down. As a result, the bottom of the contact hole between the drain select transistors SGD becomes lower than the bottom of the diffusion layer 20B (breakthrough of contact). This results in short-circuiting of the contact 19 and the semiconductor substrate 11.

On the other hand, even if the contact 19 in the source select transistors SGS penetrates to short-circuit to the semiconductor substrate 11, it does not matter as long as the NAND type flash memory operates in condition where an electric potential of the contact 19 between the source select transistors SGS is the same as that of the semiconductor substrate 11. The operations of the NAND type flash memory of the embodiment are divided into (1) program operations, (2) erasure operations and (3) read operations. In the (1) program operations and the (3) read operations, the contact 19 between the source select transistors SGS and the semiconductor substrate 11 are set to Vss (reference electric potential) and the electric potential of the contact 19 between the source select transistors SGS is the same as that of the semiconductor substrate 11. As a result, no short-circuit current flows from the contact 19 between the source select transistors SGS to the semiconductor substrate 11.

Further, in the (2) erasure operations, the electric potential of the semiconductor substrate 11 is set to Vera (about 20 to 30 V) but the contact 19 between the source select transistors SGS has the same electric potential of Vers or enters a floating state. As a result, no short-circuit current flows from the contact 19 between the source select transistors SGS to the semiconductor substrate 11.

On the other hand, in the (1) program operations and (3) read operations, the contact 19 between the drain select transistors SGD is supplied with a voltage different from that of the semiconductor substrate 11. Accordingly, the bottom surface of the contact 19 between the drain select transistors SGD needs to be at a level higher than that of the diffusion layer 20B in order to prevent a short-circuit current from flowing between the semiconductor substrate 11 and the contact 19 between the drain select transistors SGD.

Although a case where the bottom of the contact hole between the source select transistors SGS is lower than that of the diffusion layer 20B has been described in the embodiment, the bottom of the contact hole between the source select transistors SGS may be at a level higher than that of the diffusion layer 20B.

Further, there is no silicon nitride film in the vicinity of the semiconductor substrate 11 between the source select transistor SGS stack gates. Therefore, no electrons are trapped by silicon nitride films. Accordingly, it is possible to prevent a threshold voltage of the source select transistors SGS from increasing due to electron trapping.

A description will be given of a method for manufacturing the NAND type flash memory of the embodiment.

FIGS. 3A to 3F, FIGS. 4A to 4F, FIGS. 5A to 5F, FIGS. 6A to 6F, FIGS. 7A to 7F and FIGS. 8A to 8F are cross-sectional views showing manufacturing steps of the NAND type flash memory of the embodiment. Similar to FIGS. 2A to 2F, FIGS. 3A, 4A, 5A, 6A, 7A and 8A show the cross-sectional profiles of the memory cell and the source select transistor SGS, FIGS. 3B, 4B, 5B, 6B, 7B and 8B show the cross-sectional profiles of the memory cell and the drain select transistor SGD, and FIGS. 3C, 4C, 5C, 6C, 7C and 8C show the cross-sectional profiles of the peripheral transistor PT. Further, FIGS. 3D, 4D, 5D, 6D, 7D and 8D show the cross-sectional profiles taken along line D-D' of FIG. 1. FIGS. 3E, 4E, 5E, 6E, 7E and 8E show the cross-sectional profiles taken along line E-E' of FIG. 1. FIGS. 3F, 4F, 5F, 6F, 7F and 8F show the cross-sectional profiles taken along the broken line of FIG. 2C.

Figure 3A:
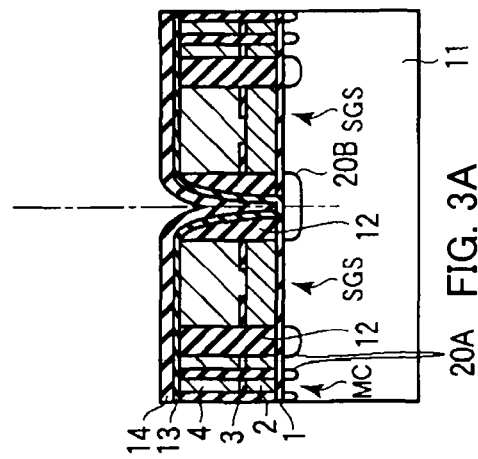
FIGS. 3A to 3F are cross-sectional views showing manufacturing steps of the NAND type flash memory according to the embodiment.
Figure 3B:
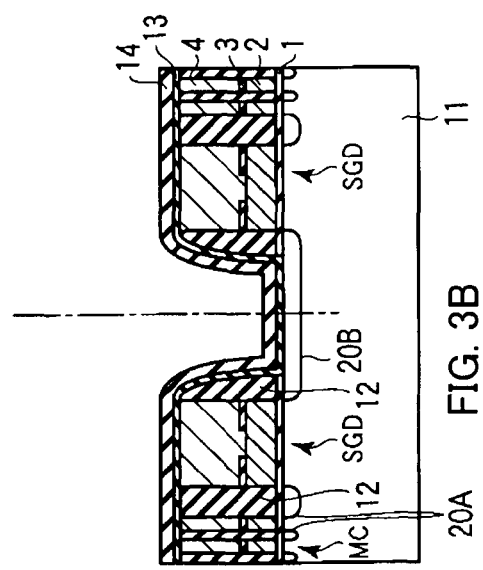
Figure 3C:
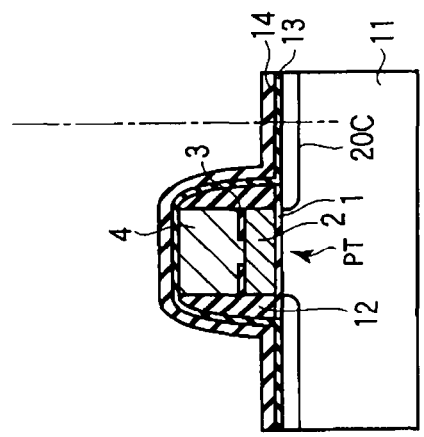
Figure 3D:
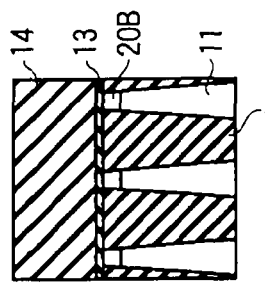
Figure 3E:
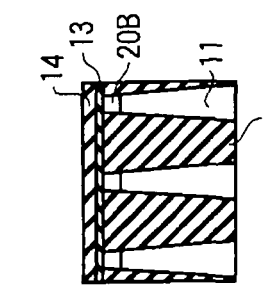
Figure 3F:
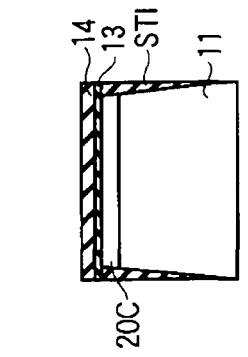
Figure 6A:
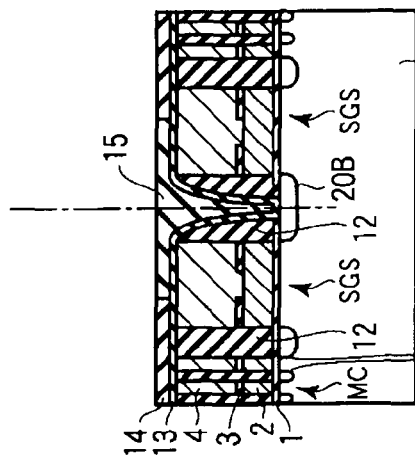
FIGS. 6A to 6F are cross-sectional views showing manufacturing steps of the NAND type flash memory according to the embodiment.
Figure 6D:
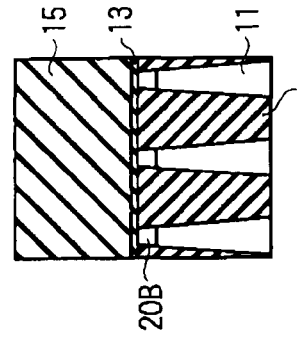
Figure 6B:
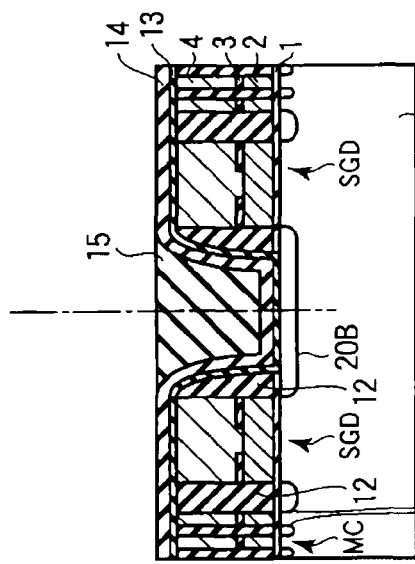
Figure 6E:
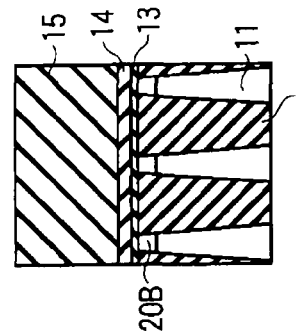
Figure 6C:
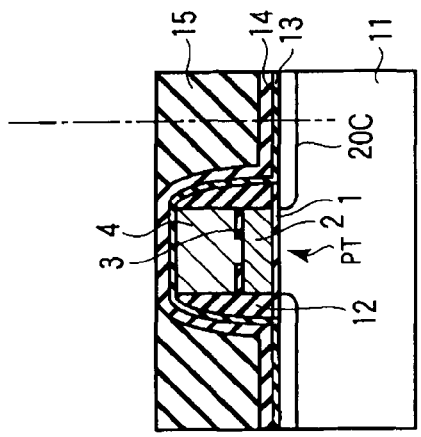
Figure 6F:
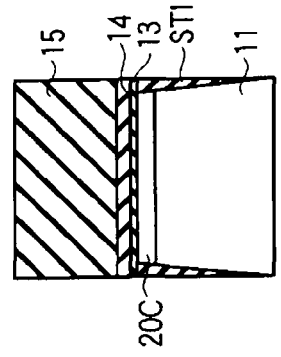
Figure 7A:
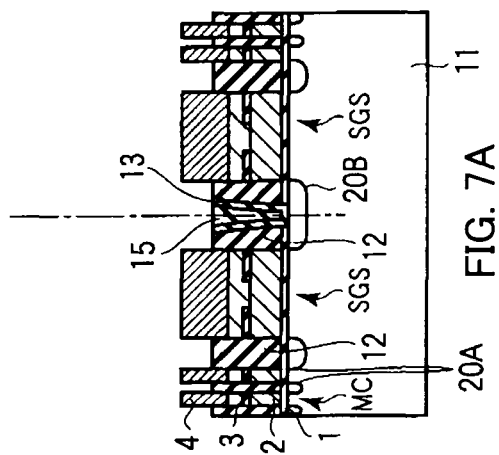
FIGS. 7A to 7F are cross-sectional views showing manufacturing steps of the NAND type flash memory according to the embodiment.
Figure 7B:
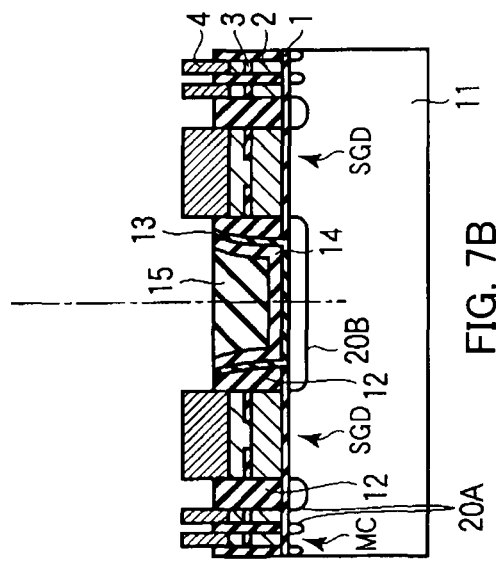
Figure 7C:
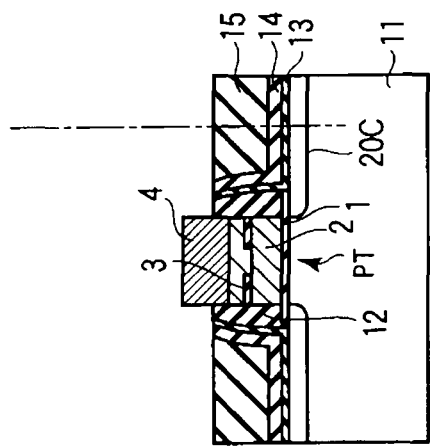
Figure 7D:
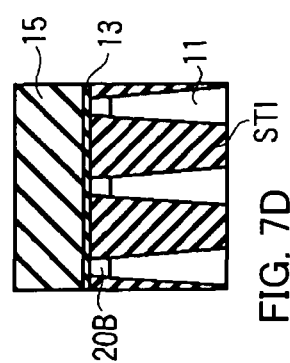
Figure 7E:
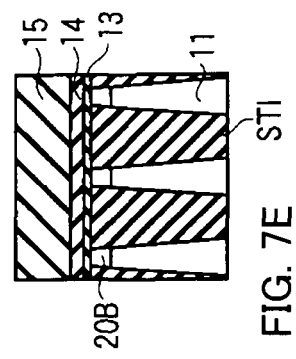
Figure 7F:
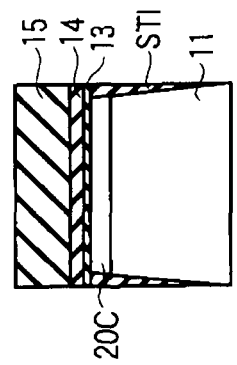
Figure 8A:
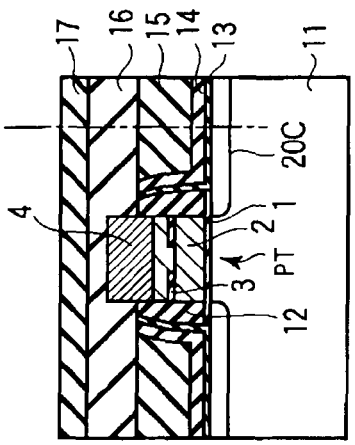
FIGS. 8A to 8F are cross-sectional views showing manufacturing steps of the NAND type flash memory according to the embodiment.
Figure 8D:
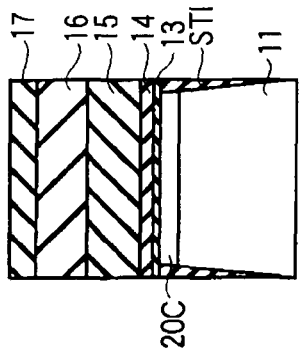
Figure 8B:
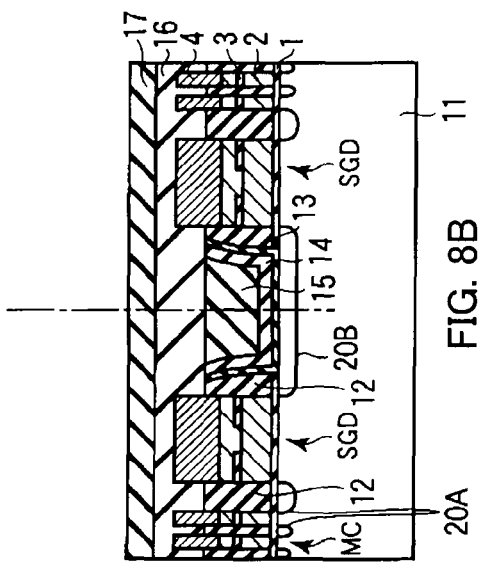
Figure 8E:
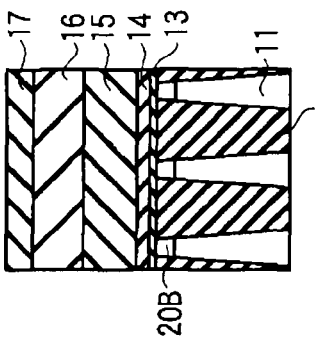
Figure 8C:
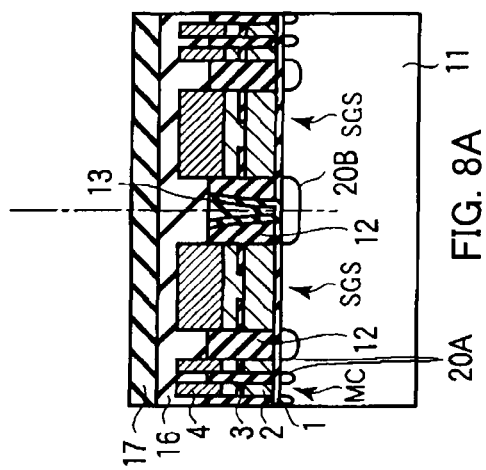
Figure 8F:
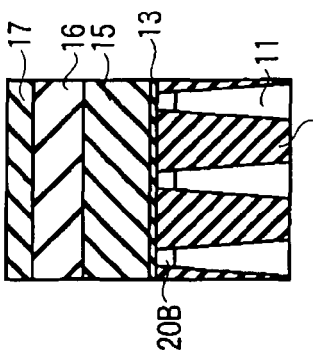

First, by performing typical processes as in the case of a conventional NAND type flash memory, the respective stack gates of the memory cell MC, the source select transistor SGS, the drain select transistor SGD and the peripheral transistor PT are formed on the semiconductor substrate 11 as shown in FIGS. 3A to 3F. Further, an impurity is introduced into a surface region of the semiconductor substrate 11 by ion implantation, to form the diffusion layers 20A, 20B, 20C as shown in FIGS. 3A to 3C.

The memory cell MC stack gate has the floating gate electrode 2, the inter-gate insulating film 3 and the control gate electrode 4 formed on the gate insulating film 1 which is formed on the semiconductor substrate 11 in the order. The respective stack gates of the source select transistor SGS, the drain select transistor SGD and the peripheral transistor each have the first gate electrode 2, the inter-gate insulating film 3 and the control gate electrode 4 formed on the gate insulating film 1 which is formed on the semiconductor substrate 11 in the order. The respective inter-gate insulating films 3 of the source select transistor SGS stack gate, the drain select transistor SGD stack gate and the peripheral transistor PT stack gate each have the opening, to electrically connect the first gate electrode 2 and the control gate electrode 4 to each other.

Further, a gap between the memory cell MC stack gates, that between the memory cell MC stack gate and the source select transistor SGS stack gate, and that between the memory cell MC stack gate and the drain select transistor SGD stack gate are buried with the inter-layer insulating film 12, and the sidewall insulating film 12 is formed on the side surfaces of the source select transistor SGS stack gate, the drain select transistor SGD stack gate and the peripheral transistor PT stack gate, respectively. Then, the inter-layer insulating film 12 on the memory cell MC stack gate and the source select transistor SGS stack gate is removed by anisotropically etching, for example, to leave the inter-layer insulating film 12 only on the side surfaces of the source select transistor SGS stack gate, the drain select transistor SGD stack gate and the peripheral transistor PT stack gate, respectively.

Subsequently, the spacer film 13, a silicon oxide film, for example, is formed on the stack gates and the sidewall insulating film (interlayer insulating film) 12, as shown in FIGS. 3A to 3F. Further, the stopper film 14, a silicon nitride film, for example, is formed on the spacer film 13. In this case, since the spacing between the source select transistor SGS stack gates is small so that the sidewall insulating film 12 may be close to them, the stopper film 14 formed between the source select transistor SGS stack gates is thicker than the stopper film 14 formed in the other portions, as shown in FIG. 3A. Further, the stopper film 14 between the source select transistor SGS stack gates is not formed uniformly over the semiconductor substrate 11. That is, the upper surface of the stopper film 14 between the source select transistor SGS stack gates may be formed at a level higher than that of the stopper film 14 between the drain select transistor SGD stack gates.

Next, a resist film is patterned by lithography so that the resist film is opened only between the source select transistors SGS, to remove the stopper film 14 formed between the source select transistors SGS, as shown in FIG. 4A. The opening in the resist film is linear shape and extends in the second direction. In this case, the opening in the resist film is arranged so as to be positioned on the source select transistor SGS stack gate. That is, the end of the stopper film 14 (opening end) exists in the position which overlaps with the source select transistor SGS stack gate as viewed in a direction perpendicular to a principal plane of the semiconductor substrate 11 (as viewed from the above).

Next, the inter-layer insulating film 15, a silicon oxide film, for example, is formed on a structure shown in FIGS. 4A to 4F, as shown in FIGS. 5A to 5F. Then, the inter-layer insulating film 15 is polished using the stopper film 14 as a polishing stopper, to planarize the upper surface of the inter-layer insulating film 15 as shown in FIGS. 6A to 6F by chemical mechanical polishing (CMP). In this case, the end of the stopper film 14 (opening end) exists in the position which overlaps with the source select transistor SGS stack gate as viewed in the direction perpendicular to the principal plane of the semiconductor substrate 11 (as viewed from the above). As a result, even if a misalignment occurs during patterning of the resist film by use of lithography, it is possible to securely remove the stopper film 14 between the source select transistor stack gates. Moreover, the stopper film 14 is present over portions between the memory cells MC and between the memory cell MC and the source-side select transistor SGS. As a result, it is possible to prevent dishing of the inter-layer insulating film 12 between the memory cells MC and between the memory cell MC and the source-side select transistor SGS.

Afterward, the inter-layer insulating film 15, the stopper film 14 and the spacer film 13 are etched by reactive ion etching (RIE) so as to expose surfaces of the stack gates of the memory cell MC, the source select transistor SGS, the drain select transistor SGD and the peripheral transistor PT, respectively. Subsequently, a metal film is deposited on the stack gates, and heat treatment is performed on the stack gates, and then the unreacted metal film is removed. In such a manner, the control gate electrode 4 is modified into silicide partially or totally. The metal film is made of Ni, Ti, Co, Pt, Pd, Ta, or Mo, for example.

Next, the inter-layer insulating film 16 silicon oxide film, for example, is formed on a structure shown in FIGS. 7A to 7F, as shown in FIGS. 8A to 8F. Then, the silicon nitride film 17 is formed on the inter-layer insulating film 16.

Afterward, further, the inter-layer insulating film 18 (silicon oxide film, for example) is formed on the silicon nitride film 17, and the inter-layer insulating film 18 is polished by CMP using the silicon nitride film 17 as a stopper to planarize the upper surface of the inter-layer insulating film 18, as shown in FIGS. 2A to 2C.

Next, a contact hole is formed by RIE between the source select transistor SGS stack gates, between the drain select transistor SGD stack gates and on the diffusion layers 20B, 20C of the peripheral transistor PT, respectively.

Although the spacing between the source select transistor SGS stack gates is smaller than that between the drain select transistor SGD stack gates, the stopper film (silicon nitride film) 14 is not present there, so that the contact hole can be formed through to the semiconductor substrate 11 sufficiently. Moreover, a width of the contact hole between the source select transistor SGS stack gates can be made smaller than that of the contact hole between the drain select transistor SGD stack gates. As a result, the memory cell array can be further miniaturized.

On the other hand, the spacing between the drain select transistor SGD stack gates is larger and has the stopper film 14 formed on the semiconductor substrate 11 via the spacer film 13, so that the contact hole can be formed through to the semiconductor substrate 11 by stopping etching once with the stopper film 14 and then restarting etching under changed etching conditions. Further, the stopper film 14 is etched under the conditions where the inter-layer insulating film 12 is hard to etch, so that it is possible to simultaneously form the contact hole between the drain select transistor SGD stack gates and the contact hole between the source select transistor SGS stack gates and also to prevent over-etching of the contact hole between the source select transistor SGS stack gates. As a result, it is possible to omit the process and also to prevent the bottom surface of the contact hole between the source select transistor SGS stack gates from penetrating the diffusion layer 20B. It is possible to increase the area of contact between the diffusion layer 20B and the contact hole between the source select transistor SGS stack gates, thereby decreasing a contact resistance. Further, it is possible to form the contact hole through to the semiconductor substrate 11 also in the peripheral transistor PT diffusion layer simultaneously with the contact hole formed between the drain select transistor SGD stack gates.

Afterward, the contact plug 19 is formed between the source select transistor SGS stack gates, between the drain select transistor SGD stack gates and on the diffusion layers 20B, 20C of the peripheral transistor PT, respectively by burying a conductive material into the contact hole, as shown in FIGS. 2A to 2F.

Formation of the contact holes will be described in detail as follows: a silicon nitride film serving as the stopper film 14 is not present between the source select transistors SGS, so that the formation of the contact hole is not stopped at the stopper film on the substrate and the contact hole may be formed deep into the substrate. On the other hand, the silicon nitride film serving as the stopper film 14 is present between the drain select transistors SGD and on the diffusion layer of the peripheral transistor, so that the formation of the contact hole is temporarily stopped at the stopper film 14 on the semiconductor substrate, and then when the contact hole reaches the surface of the substrate, etching of the contact hole can be stopped. Accordingly, the contact hole formed between the source-side select gate transistors SGS is dug deep from the surface of the semiconductor substrate 11 during the processing of the contact hole. On the other hand, the contact hole formed between the drain select transistors SGD and on the diffusion layer of the peripheral transistor PT nearly reaches the surface of the semiconductor substrate 11.

In the embodiment, it is possible to reduce the spacing (distance) between the source select transistors SGS in the neighboring NAND cell units of a memory cell array. The NAND cell units having multiple memory cells and select gate transistors disposed at each end of the multiple memory cells are arranged in a matrix form. Therefore, the memory cell array can be miniaturized.

Moreover, no silicon nitride film is present between the source select transistors SGS, so that no electrons are trapped by a silicon nitride film. Accordingly, it is possible to prevent the threshold voltage of the source select transistors SGS from increasing due to electron traps.

As described hereinabove, in the embodiment, the distance between the source select transistors SGS can be reduced and the memory cell array can be miniaturized. Moreover, the electron traps generated between the source select transistors SGS are reduced; it is possible to prevent the threshold voltage of the source select transistors SGS from increasing.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A nonvolatile semiconductor memory, comprising:
a memory cell array including a plurality of NAND cell units, each of NAND cell units having a plurality of memory cell transistors formed on a semiconductor substrate at a predetermined spacing, each of memory cell transistors having a first gate insulating film, a floating gate electrode, a second gate insulating film and a control gate electrode stacked on the semiconductor substrate in the order, each of NAND cell units having a source-side select gate transistor disposed at one end of the plurality of memory cell transistors and a drain-side select gate transistor disposed at the other end of the plurality of memory cell transistors, the source-side select gate transistors of the NAND cell unit being disposed in such a manner as to face each other and interpose a first contact therebetween, and the drain-side select gate transistors of the NAND cell unit being disposed in such a manner as to face each other and interpose a second contact therebetween;
a first silicon nitride film present in a region between the source-side select gate transistors and disposed at a position lowest from the upper surface of the semiconductor substrate; and a second silicon nitride film formed in a region between the drain-side select gate transistors and disposed at a position lowest from the upper surface of the semiconductor substrate, wherein a spacing including the first contact between the source-side select gate transistors is smaller than a spacing including the second contact between the drain-side select gate transistors, and wherein a distance from the upper surface of the semiconductor substrate to the upper surface of the first silicon nitride film is larger than a distance from the upper surface of the semiconductor substrate to the upper surface of the second silicon nitride film.

2. The nonvolatile semiconductor memory according to claim 1, wherein the first silicon nitride film is formed at a level higher than the upper surface of the control gate electrode and the second silicon nitride film is formed at a level lower than the upper surface of the control gate electrode.

3. The nonvolatile semiconductor memory according to claim 2, wherein the first silicon nitride film extends into the region between the drain-side select gate transistors.

4. The nonvolatile semiconductor memory according to claim 1, wherein a silicon oxide film is formed between the first silicon nitride film and the semiconductor substrate.

5. The nonvolatile semiconductor memory according to claim 1, wherein the first contact is formed in the region between the source-side select gate transistors through the first silicon nitride film, to be electrically connected to a diffusion layer of the source-side select gate transistor; and the second contact is formed in the region between the drain-side select gate transistors through the second silicon nitride film, to be electrically connected to the diffusion layer of the drain-side select gate transistor.

6. The nonvolatile semiconductor memory according to claim 4, wherein the first contact is formed in the region between the source-side select gate transistors through the first silicon nitride film and the silicon oxide film, to be electrically connected to a diffusion layer of the source-side select gate transistor; and the second contact is formed in the region between the drain-side select gate transistors through the silicon oxide film and the second silicon nitride film, to be electrically connected to the diffusion layer of the drain-side select gate transistor.

7. The nonvolatile semiconductor memory according to claim 6, wherein the first contact is dug from the surface of the semiconductor substrate into the semiconductor substrate deeper than the second contact.

8. The nonvolatile semiconductor memory according to claim 6, wherein the bottom surface of the second contact is at a level higher than the bottom surface of the diffusion layer of the drain-side select gate transistor.

9. The nonvolatile semiconductor memory according to claim 6, wherein the first contact has the same electric potential as the semiconductor substrate or is in a floating state.

10. A method for manufacturing a nonvolatile semiconductor memory, comprising:

forming gate electrodes of a memory cell transistor, a source-side select gate transistor and a drain-side select gate transistor, respectively on a semiconductor substrate;

forming a sidewall insulating film on side surfaces of the gate electrodes of the source-side select gate transistor and the drain-side select gate transistor, respectively;

forming a stopper film on the gate electrodes, on the sidewall insulating films, on the semiconductor substrate between the source-side select gate transistors and on the semiconductor substrate between the drain-side select gate transistors in such a manner that a minimum distance from the upper surface of the semiconductor substrate to the surface of the stopper film is larger between the source-side select gate transistors than between the drain-side select gate transistors;

removing the stopper film formed between the gate electrodes of the source-side select gate transistors;

forming a first inter-layer insulating film in a region between the gate electrodes of the source-side select gate transistors from which the stopper film is removed, and on the stopper film which remained; and forming a source contact hole between the gate electrodes of the source-side select gate transistors and a drain contact hole between the gate electrodes of the drain-side select gate transistors, a spacing including the source contact hole between the source-side select gate transistors being smaller than a spacing including the drain contact hole between the drain-side select gate transistors.

11. The method for manufacturing the nonvolatile semiconductor memory according to claim 10, wherein the gate electrode is formed by stacking a first gate insulating film, a floating gate electrode, a second gate insulating film and a control gate electrode on the semiconductor substrate in the order.

12. The method for manufacturing the nonvolatile semiconductor memory according to claim 10, wherein a distance between the source-side select gate transistors is smaller than a distance between the drain-side select gate transistors, and wherein the stopper films are formed in such a manner that the stopper films formed on the sidewall insulating films facing each other between the gate electrodes of the source-side select gate transistors are united with each other, and the stopper films formed on the sidewall insulating films facing each other between the gate electrodes of the drain-side select gate transistors are separated from each other.

13. The method for manufacturing the nonvolatile semiconductor memory according to claim 10, wherein an opening end of the stopper film formed after removing the stopper film exists in the position which overlaps with the gate electrode of the source-side select transistor as viewed in a direction perpendicular to the semiconductor substrate.

14. The method for manufacturing the nonvolatile semiconductor memory according to claim 10, comprising:

removing the first inter-layer insulating film until the upper portion of the gate electrodes is exposed, after forming the first inter-layer insulating film;

forming a metal film on the first inter-layer insulating film and the gate electrodes;

reacting the metal film and the gate electrodes so as to form metal-semiconductor compounds;

removing the metal film unreacted;

forming a second inter-layer insulating film on the first inter-layer insulating film and the metal-semiconductor compounds; and forming a first silicon nitride film on the second inter-layer insulating film.

15. The method for manufacturing the nonvolatile semiconductor memory according to claim 10, wherein a second silicon nitride film is formed as the stopper film.

16. The method for manufacturing the nonvolatile semiconductor memory according to claim 10, wherein the drain contact hole is formed by anisotropically etching until the stopper film is exposed under a first condition where stopper film is hard to etch, and then by anisotropically etching under a second condition where the semiconductor substrate is hard to etch.

17. The method for manufacturing the nonvolatile semiconductor memory according to claim 16, wherein the first and second conditions use different process gas.

18. The method for manufacturing the nonvolatile semiconductor memory according to claim 16, wherein the source contact hole has reached the semiconductor substrate when the etching conditions are changed from the first condition to the second condition.

* * * * *